United States Patent [19]

McDonald

[11] 3,879,724

[45] Apr. 22, 1975

[54] INTEGRATING ANALOG TO DIGITAL CONVERTER

[75] Inventor: John C. McDonald, Los Altos, Calif.

[73] Assignee: Vidar Corporation, Mountain View, Calif.

[22] Filed: Nov. 19, 1973

[21] Appl. No.: 417,367

[52] U.S. Cl....... 340/347 AD; 328/158; 340/347 NT

[51] Int. Cl. ........................................... H03k 13/17

[58] Field of Search............... 340/347 NT, 347 AD; 318/361; 328/158

[56] References Cited

UNITED STATES PATENTS

| | | | |
|---|---|---|---|
| 3,241,016 | 3/1966 | Wattson | 318/18 |
| 3,422,424 | 1/1969 | Belet | 340/347 AD |
| 3,516,085 | 6/1970 | Dano | 340/347 AD |
| 3,605,001 | 9/1971 | Toshima-ku | 318/631 |
| 3,665,457 | 5/1972 | Wheable | 340/347 NT |
| 3,678,501 | 7/1972 | Prill | 340/347 AD |
| 3,710,377 | 1/1973 | Guillen et al. | 340/347 AD |
| 3,714,590 | 1/1973 | Freeman et al. | 328/158 |
| 3,721,975 | 3/1973 | Brinkman et al. | 340/347 AD |

*Primary Examiner*—Charles E. Atkinson
*Assistant Examiner*—Vincent J. Sunderdick
*Attorney, Agent, or Firm*—Flehr, Hohbach, Test, Albritton & Herbert

[57] ABSTRACT

An integrating analog to digital converter which utilizes a successive approximation analog to digital converter and integrates by adding a predetermined number of approximations and averages the sum.

9 Claims, 3 Drawing Figures

INTEGRATING ANALOG TO DIGITAL CONVERTER

BACKGROUND OF THE INVENTION

The present invention is directed to an integrating analog to digital (A/D) converter.

Prior analog to digital conversion techniques can be conveniently classified into two groups; namely, integrating and instantaneous.

Integrating A/D converters include a VCO (voltage controlled oscillator) with counter and the dual slope techniques. Both provide normal mode integration by measuring a voltage over a predetermined period of time to determine its average value. This technique causes the average voltage to be read in the presence of noise. The VCO technique tends to drift and, in addition, a precision oscillator is required to gate the VCO to the counter. Thus, it is relatively costly. However, the speed of this type of A/D converter is faster than the second or dual slope type converter. In the dual slope technique, the unknown voltage generates one slope and the reference voltage generates a second slope with a counter measuring the total time of the reference slope. The dual slope technique provides normal mode integration and stability at low cost but at the expense of speed.

Instantaneous A/D converters, of course, by definition offer no integration of the analog input waveform. The digital output is representative of input voltage at a given instant of time. Converters include the servo type where an UP/DOWN counter is utilized, the ramp type where the time is measured from the beginning of the ramp to the time at which the ramp voltage equals the input voltage, and lastly the successive approximation A/D converter. The latter uses a digital to analog converter which provides an analog output signal which is compared with the analog input signal. By successive approximation starting at the most significant bit (MSB) the digital to analog converter is caused to produce an analog signal equal in magnitude to the input analog signal. Such a converter is fast and very accurate.

OBJECTS AND SUMMARY OF THE INVENTION

It is a general object of the present invention to provide an A/D converter which provides alternatively instantaneous and integrating operation.

It is another object of the invention to provide an A/D converter as above which is temperature stable.

It is another object of the invention to provide an A/D converter as above which is largely digital in construction.

It is another object of the invention to provide an A/D converter as above which has common mode rejection without the use of a differential amplifier.

It is another object of the invention to provide an integrating A/D converter which easily accommodates analog input signals of either + or − polarity.

In accordance with the above objects an integrating analog to digital converter is provided comprising analog to digital (A/D) converting means to provide a substantially instantaneous digital output signal indicative of the instantaneous amplitude of an analog input signal. Means are coupled to the converting means for initiating successive A/D conversions. The digital outputs of a predetermined number of successive conversions are added. Means are provided for dividing the sum of the additions by the number of conversions to provide an integrated digital output representative of the analog input signal.

DETAILED DESCRIPTION OF THE PREFERRED EMBODIMENT

Figure 1:
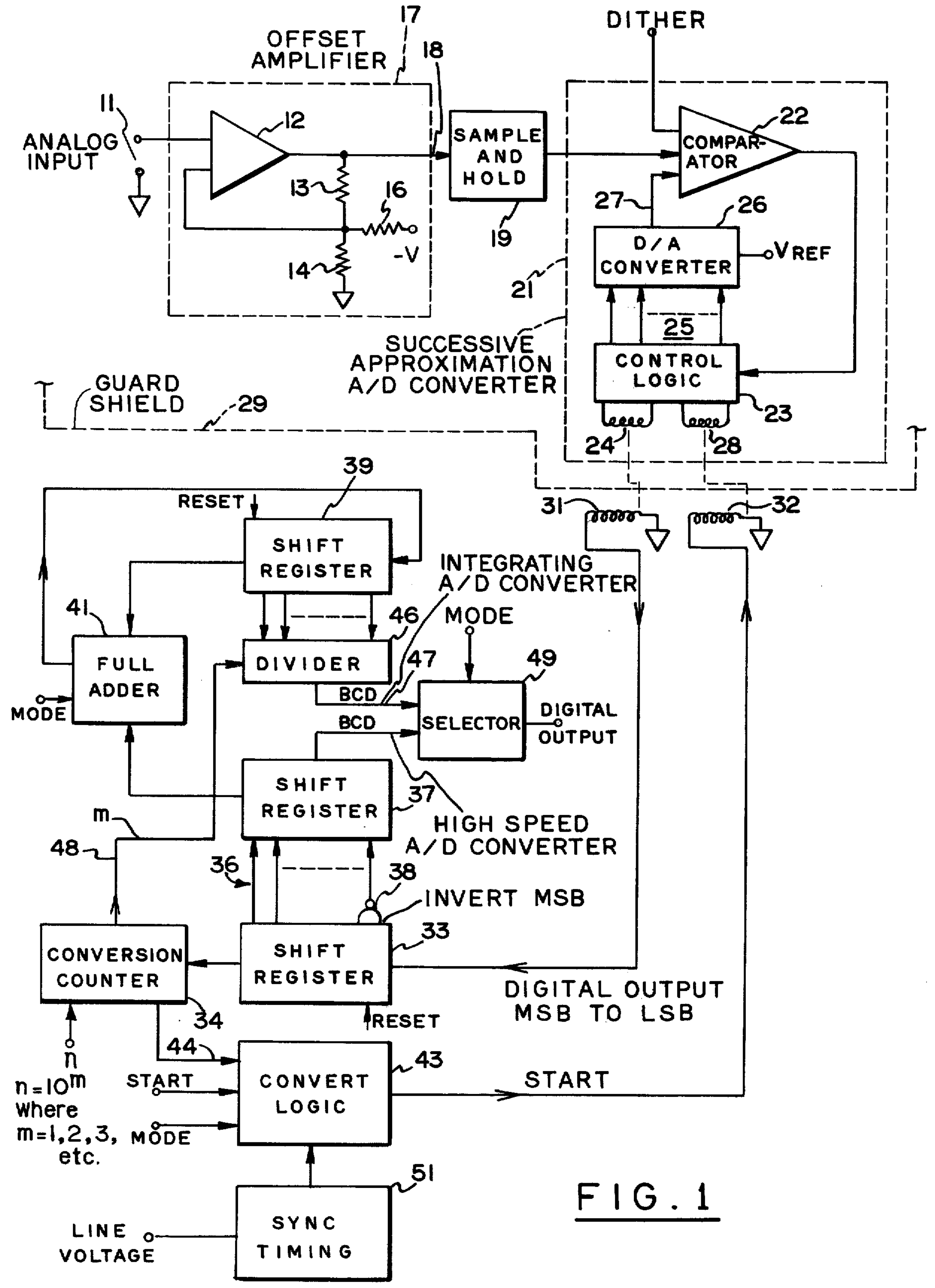
FIG. 1 is a block diagram of an A/D converter embodying the present invention.

Referring now to FIG. 1, an analog input voltage waveform is applied across terminals 11 to a differential amplifier 12. The output voltage of amplifier 12 is offset by means of a negative voltage source designated −V which is coupled to a feedback network including resistors 13, 14, referenced to common, and a resistor 16 which couples the negative voltage source to the feedback network. The combination of the feedback network 13, 14 and 16 and the amplifier 12 constitutes an offset amplifier 17. Such amplifier provides an output on line 18 of a single voltage polarity or a unipolar output where the analog input is bipolar.

The unipolar output on line 18 is coupled to a sample and hold network 19. This sample and hold network 19 is coupled to the input of a successive approximation A/D converter indicated by dashed block 21. Such A/D converter may be of standard configuration. One type acceptable for use in the embodiment of the present invention is sold under the trademark REDCOR model 663. Such a converter comprises a comparator 22 to which the analog input signal is coupled along with the D/A converter 26 output 27. The difference between these voltages is coupled to a feedback loop including a control logic unit 23. The digital output of the control logic unit 23 is coupled by lines 25 to digital to analog converter 26. The analog voltage on line 27 is derived from $V_{REF}$ as controlled by digital lines 25. In this manner, control logic unit 23 produces a digital output value in a successive approximation manner which approaches the analog input to comparator 22. Such digital output at 24 is a succession of binary bits starting with the most significant bit (MSB) down to a least significant bit (LSB). Each analog to digital conversion by the successive approximation converter 21 is initiated through a start winding 28 coupled to control logic unit 23.

Both offset amplifier 17 and the successive approximation A/D converter 21 are isolated from the remainder of the circuitry by a guard shield 29. The digital output of winding 24 is coupled to a secondary winding 31 to thus transformer couple through the guard shield circuit to the remaining circuitry; the start winding 28 is similarly coupled through the guard shield to a primary winding 32. Such shielding provides for common mode noise reduction.

Comparator 22 of the converter 21 includes an input designated "dither." This is necessary for providing enhanced resolution of the overall integrating A/D converter which will be described below.

The instantaneous digital output of converter 21 is coupled through the transformer constituting windings 24 and 31 to a shift register 33. As discussed above, this is a serial train of binary information with the most significant bit being the first bit and the least significant bit the last bit. When register 33 is filled, a conversion counter unit 34 recognizes that the successive approximation converter has completed its function in providing an instantaneous digital indication of the instantaneous amplitude of the analog input at terminals 11.

After one conversion, the contents of shift register 33 are transferred via multiple lines 36 into a shift register 37. The line containing the most significant bit, however, includes an inverter 38 which inverts this bit when the total digital output from the converter 21 is shifted into shift register 37. The purpose of the inverter is to convert the digital output of converter 21 to a true two's complement number. A typical successive approximation analog to digital converter with an offset input voltage equal to the full scale voltage will indicate a negative input or negative full scale input in a two's complement binary form with the exception that the most significant bit, MSB, is inverted. Therefore, to provide a true two's complement for negative input voltages, this bit must be inverted. From an absolute standpoint, of course, the successive approximation A/D converter 21 receives only positive inputs because of the offset amplifier 17.

TABLE I

| INPUT VOLTAGE | DIGITAL REPRESENTATION MSB | | | | | | | | | LSB |
|---|---|---|---|---|---|---|---|---|---|---|
| + FULL SCALE | 0 | 1 | 1 | 1 | 1 | 1 | 1 | 1 | 1 | 1 |
| | 0 | | | | | | | | | 1 |
| | 0 | | | | | | | | | 1 |
| | 0 | | | | | 0 | 0 | 0 | 1 | 0 |
| | 0 | | | | | | 0 | 0 | 0 | 1 |
| 0 | 0 | 0 | 0 | 0 | 0 | 0 | 0 | 0 | 0 | 0 |
| | 1 | 1 | 1 | 1 | 1 | 1 | 1 | 1 | 1 | 1 |
| | 1 | 1 | 1 | 1 | 1 | 1 | 1 | 1 | 0 | 0 |
| | 1 | | | | | | | | | |
| | 1 | | | | | | | | | |
| − FULL SCALE | 1 | 0 | 0 | 0 | 0 | 0 | 0 | 0 | 0 | 0 |

More specifically, the contents of shift register 37 while providing an instantaneous A/D conversion indication of the instantaneous amplitude of the analog input signal, also allows an integrating A/D conversion mode. This is accomplished by adding the contents of a shift register 39 to register 37 by a full adder 41. Shift register 39 contains the binary running sum of the instantaneous readings loaded into shift register 37. Thus, the full adder 41 in combination with the shift register 37 and 39 constitute means for adding the digital output of a predetermined number of successive conversions. This predetermined number is determined by conversion counter 34 where the number is determined by its *n* input. Conversion counter 34 is coupled to a convert logic unit 43 by a line 44. The counter 34 causes logic unit 43 to give start indications through transformer 32, 28 to the successive approximation A/D converter 21 after each conversion is completed up to *n* number of conversions. At this time the integration has been completed and the divider unit 46 coupled to shift register 39 contains the sum of the predetermined number, *n*, of analog to digital conversions performed by successive approximation converter 21. If the sum is now divided by *n*, the number of conversions made, the output on lines 47 will be the integrated value of the analog input waveform on terminals 11 in digital output format over the period of the *n* conversions.

In the preferred embodiment of the invention a binary coded decimal or BCD format is used where the total number of conversions *n* is equal to $10^m$ where *m* is an integer. Thus, by definition, division is accomplished merely by truncation or a shifting of the "decimal" or base point. Thus, conversion counter 34 by means of line 48 supplies the quantity *m* to divider 46 to shift the decimal point *m* number of times. From a more general standpoint, if a general binary radix were desired, then the number of conversions, *n*, should be made equal to n, should be made equal to $B^m$ where *m* is still an integer and B is the radix.

Where merely the instantaneous or high speed A/D conversion of an analog input is desired, the device of the present invention may function in that mode. Here selector unit 49 which is coupled to both the output of shift register 37 and 46 would select register 37 which contains the successive approximation A/D converter digital output 21. The convert logic 43 would, of course, only make a single conversion and adder 41 would not function.

In the integrating A/D conversion mode, all components function including a sync timing unit 51 which is either coupled to a 60 cycle ac line voltage or is driven by a crystal oscillator unit. For an effective integrating output it is necessary that the conversions are made cyclically; in other words, that the samples of the waveform at input terminals 11 are equally spaced. Thus, sync timing unit 51 is coupled to conversion logic unit 43 to inhibit a start indication to converter 21 after conversion has taken place until the next proper equally spaced time interval.

In general, it has been found that for the integrating analog to digital converter of the present invention to provide an integrated output which is identically equal to the integral of the voltage given by a voltage controlled oscillator (VCO) and associated counter, a large number of samples must be provided which are equally spaced.

Figure 2:
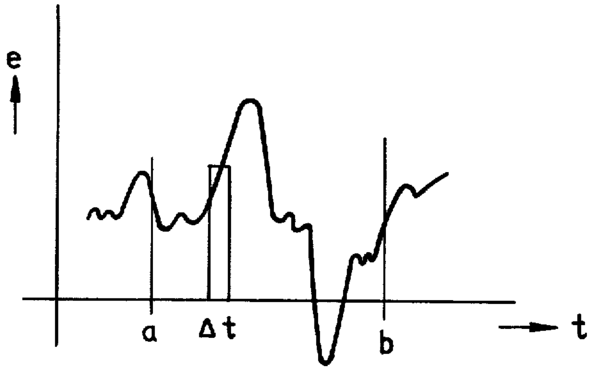
FIG. 2 is a waveform useful in understanding the invention.

Proof of this is as follows: Assume an input analog voltage waveform as shown in FIG. 2 where the amplitude of the waveform is given as *e* and integration is to be accomplished from time *a* to time *b*.

VCO CASE

The VCO transfer function is $$f = ke \text{ pulses/second} \quad (1)$$

In an incremental time $\Delta_i t$, $f$ is constant since *e* does not change during this time. The number of pulses occuring during this time is $f_i \Delta_i t$. The total pulses during the interval a to *b* is $$\text{Total pulses} = \lim_{n \to \infty} \sum_{o}^{n} f_i \, \Delta_i \, t \quad (2)$$

However, from integral calculus this is identically $$\text{Total Pulses} = \int_a^b f \, dt \quad (3)$$

Substituting for *f*

$$\text{Total pulses} = k \int_a^b e \, dt \quad (4)$$

Therefore, if the frequency of the VCO is sufficiently high so that the instantaneous frequency follows the input waveform, the total pulses accumulated in a counter is equal to a constant times the integral of the input voltage over the interval $a$ to $b$.

PRESENT INVENTION

Assume that instantaneous samples of amplitude $e_i$ are taken of the input voltage, $e_{in}$. Then the following mathematical operation is taken giving $$f(e_{in}) = \frac{e_1 + e_2 + e_3 \ldots e_n}{n} \quad (5)$$

If numerator and denominator are divided by the sampling interval, Δt, over which all the $e_i$ are measured we have $$f(e_{in}) = \frac{e_1\Delta t + e_2\Delta t + \ldots e_n\Delta t}{n\Delta t} \quad (6)$$

$$= \frac{1}{n\Delta t} \sum_{i=1}^{n} e_i\Delta t \quad (7)$$

$$= \frac{1}{b-a} \sum_{i=1}^{n} e_i\Delta t \quad (8)$$

If $n$ becomes large, $f(e_{in})$ will approach a limiting value $$f(e_{in}) = \frac{1}{b-a} \lim_{n\to\infty} \sum_{i=1}^{n} e_i\Delta t \quad (9)$$

But from integral calculus this is $$f(e_{in}) = \frac{1}{b-a} \int_a^b e\,dt \quad (10)$$

which is equal to equation (4) within a constant factor.

Therefore, as the number of equally spaced samples becomes large, the average of these samples is equal to a constant times the integral of the input voltage over the interval $b - a$.

Figure 3:
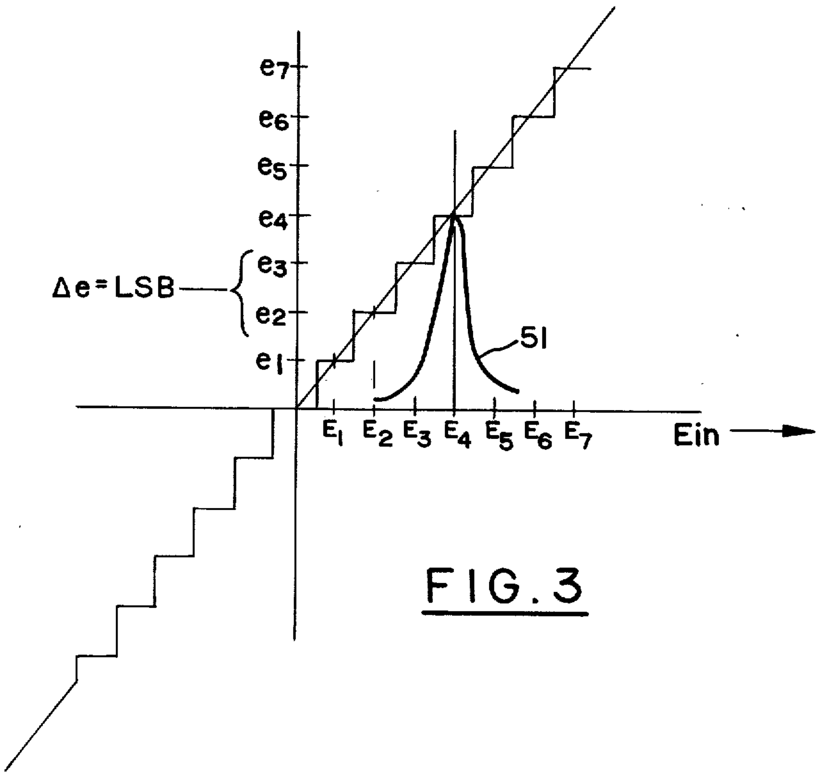
FIG. 3 is a graph useful in understanding a particular aspect of the invention.

As discussed in conjunction with the successive approximation A/D converter 21 it was stated that if dither is added via comparator 22 that the resolution of the output of the present invention would be enhanced. Dither is defined as additive noise or other periodic signals. Normally the resolution of a successive approximation converter is ±LSB/2. In other words, there is an uncertainty in the least significant bit. This is illustrated in FIG. 3 where the staircase function type transfer characteristic for a successive approximation converter is illustrated. As the analog input voltage increases from zero the binary output does not change until $E_{in}$ is equal to or greater than the voltage corresponding to LSB/2. If $E_{in}$ continues to increase, the output remains constant until the input exceeds 1.5 times LSB. Thus, from inspection, the maximum resolution is +LSB/2.

It will now be shown by example that the output of divider 46 will contain greater resolution and therefore greater accuracy if Gaussian noise is a dither to the input voltage and the output mathematical function is calculated as done in the present invention.

EXAMPLE

As illustrated in FIG. 3, Gaussian noise having an envelope 51 is added to the input voltage. So that each bit in the successive approximation is dependent on the previous bit, the input signal is sampled and held by unit 19 as shown in FIG. 1. If the dither noise amplitude is sufficiently large, the output corresponding to each sample and conversion will vary since the noise adds to and subtracts from the dc signal. If the various conversions provide output values $e_1, e_2, \ldots$, then $f(e_{in})$ in equation (5) will provide a final result which will be an interpolation between ±LSB/2 providing more bits are included in the $f(e_{in})$ than in each conversion. The following statistical analysis demonstrates this resolution enhancement. When noise is applied to the signal, the output of each conversion will most probably change. This output is a discrete valued random variable X. The expectation of the random variable equals the function of equation (5).

$$E(X) = f(e_{in}) = \sum_i X_i P_r(X_i) \quad (11)$$

Since the present invention will calculate $f(e_{in})$, the expectation of X can be used to calculate the system output in divider 46.

If the standard deviation of the noise is approximately equal to LSB, then the probability that the output will vary greatly from the average value is small. Therefore, only the $X_i$ near the dc value need be considered. The system output may be calculated by equation 11 as $$f(E_{in}) = E(X) = e_1P_r(e_1) + e_2F_r(e_2) + e_3P_r(e_3) + e_4P_r(e_4) +$$
$$e_5P_r(e_5) + e_6P_r(e_6) + e_7P_r(e_7) + \ldots$$

Assume that E takes on successive quiescent values from $E_4$ to $E_5$. This will demonstrate a linear interpolation within the ±LSB/2 individual conversion resolution. If LSB = 1 mv and $e_1$ = 1 mv then $e_2 = e_1 + 1$ mv
$e_3 = e_2 + 2$ mv
$e_n = e_{n-1} + (n-1)$ mv Thus $$f(E_{in}) = e_1 \{P_r(e_1) + P_r(e_2) + P_r(\bar{\bar{e}}_3) + \ldots\} + 1 \text{ mv } P_r(e_2) + 2 \text{ mv } P_r(e_3) + \ldots$$
$$= e_1 + 1 \text{ mv } P_r(e_2) + 2 \text{ mv } P_r(e_3) + \ldots$$

Table 2 summarizes calculations of $f(E_{in})$ versus $E_{in}$ as $E$ varies from 4 mv to 5 mv. Table 3 indicates the low error resulting from the mathematical operation.

TABLE 2

| $E_{in}$ | $e_2P_r(e_2)$ + | $e_3P_r(e_3)$ + | $e_4P_r(e_4)$ + | $e_5P_r(e_5)$ + | $e_6P_r(e_6)$ + | $e_7P_r(e_7)$ | | $f(E_{in})$ |
|---|---|---|---|---|---|---|---|---|
| $E_4$ + 0 | .12 | .726 | 1.532 | 1.205 | .366 | .042 | = | 3.991 |
| $E_4$ + .2mv | .082 | .591 | 1.504 | 1.425 | .516 | .070 | = | 4.188 |
| $E_4$ .4 | .054 | .465 | 1.424 | 1.620 | .708 | .119 | = | 4.390 |
| $E_4$ + .6 | .034 | .381 | 1.220 | 1.880 | .930 | .189 | = | 4.634 |
| $E_4$ + .8 | .02 | .258 | 1.144 | 1.875 | 1.188 | .287 | = | 4.772 |
| $E_4$ + 1.0mv | .014 | .180 | .968 | 1.915 | 1.446 | .427 | = | 4.950 |

TABLE 3

| $E_{in}$ | $f(E_{IN})$ | Error |
|---|---|---|
| $e_4 + 0$ | $e_4 - .009$ | .009mv |
| $e_4 + .2$mv | $e_4 + .188$ | −.012mv |
| $e_4 + .4$ | $e_4 + .390$ | −.010mv |
| $e_4 + .6$ | $e_4 + .634$ | +.034mv |
| $e_4 + .8$ | $e_4 + .772$ | −.028mv |
| $e_4 + 1.0$mv | $e_4 + .950$ | −.050mv |

Thus, interpolation within the LSB has occured. The error at $e$ + 1.0mv will be zero if enough terms are taken in the calculation series.

Instead of noise a triangular periodic waveshape may be superimposed on the input signal. This waveshape should possess halfwave symmetry and must be of the same period as the averaging period. A sinusoid can also be used instead of the triangle.

It has been found experimentally that in the integrating mode the sample and hold circuit is not necessary; it is, however, in the high speed mode.

For some applications to prevent excessive aliasing errors out of band noise filtering should be used.

Thus, the present invention has provided an improved A/D converter which provides high speed operation and can give voltage integration. It is largely digital in construction and is temperature stable. Also as discussed above, it is extremely accurate because of the accuracy gained by averaging a number of successive approximation signals. Additionally, because the offset amplifier, it accommodates signals of either + or − polarity.

I claim:

1. An integrating analog to digital converter comprising: successive approximation analog to digital (A/D) converting means to provide a substantially instantaneous digital output signal indicative of the amplitude of an analog input signal; means coupled to said A/D converting means for initiating consecutive A/D conversions; means for adding the digital outputs of a predetermined number of said consecutive conversions; means for dividing the sum of said additions by said predetermined number to provide an integrated digital output representative of said analog input signal.

2. An integrating analog to digital converter as in claim 1 where said number of conversions is $B^m$ where B is the radix of the number system being used for the digital output and $m$ is an integer where said means for dividing is responsive to $m$ to divide by moving a base point $m$ times.

3. An integrating analog to digital converter as in claim 1 together with means for making said conversions cyclically.

4. An integrating analog to digital converter as in claim 1 together with transformer means for coupling said A/D converting means to said adding means whereby common mode rejection is provided.

5. An integrating analog to digital converter as in claim 4 where said A/D means is shielded.

6. An integrating analog to digital converter as in claim 1 where after division the least significant bit is retained as valid.

7. An integrating analog to digital converter as in claim 6 including means for modulating said analog input signal with a periodic signal.

8. An integrating analog to digital converter as in claim 1 together with offset amplifier means responsive to bipolar analog input signals to provide a unipolar input to said A/D converting means.

9. An integrating analog to digital converter as in claim 7 where A/D converting means provides a digital output which for negative values of said bipolar analog input signals is in a two's complement format except for the most significant bit (MSB) and together with register means for inverting said MSB whereby said adding means functions for said negative values.

* * * * *